US008151225B2

(12) United States Patent
Maeda (10) Patent No.: US 8,151,225 B2
(45) Date of Patent: Apr. 3, 2012

(54) PATTERN LAYOUT DESIGNING METHOD, SEMICONDUCTOR DEVICE MANUFACTURING METHOD, AND COMPUTER PROGRAM PRODUCT

(75) Inventor: Shimon Maeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 12/630,643

(22) Filed: Dec. 3, 2009

(65) Prior Publication Data

US 2010/0153905 A1 Jun. 17, 2010

(30) Foreign Application Priority Data

Dec. 11, 2008 (JP) ................. 2008-316072

(51) Int. Cl.
G06F 17/50 (2006.01)
G06F 19/00 (2011.01)
G03F 1/00 (2012.01)
G21K 5/00 (2006.01)

(52) U.S. Cl. ................ 716/55; 716/52; 716/53; 716/54; 716/111; 430/5; 378/35; 700/120; 700/121

(58) Field of Classification Search .................... 716/52, 716/53, 54, 55, 111; 430/5; 378/35; 700/120, 700/121
See application file for complete search history.

(56) References Cited

U.S. PATENT DOCUMENTS

| 5,538,815 | A  * | 7/1996  | Oi et al. ............................. 430/5 |
| 5,795,685 | A  * | 8/1998  | Liebmann et al. ................ 430/5 |
| 6,004,701 | A  * | 12/1999 | Uno et al. .......................... 430/5 |
| 6,391,501 | B1   | 5/2002  | Ohnuma |
| 6,832,364 | B2 * | 12/2004 | Heng et al. ....................... 716/52 |
| 2004/0068712 | A1 * | 4/2004 | Heng et al. ....................... 716/21 |
| 2005/0268804 | A1 * | 12/2005 | Van Steenwinckel et al. ............................. 101/483 |
| 2007/0226663 | A1 * | 9/2007 | Bormann et al. ................. 716/5 |
| 2008/0037861 | A1 * | 2/2008 | Nikolsky ...................... 382/149 |

FOREIGN PATENT DOCUMENTS

| JP | 3307313 | 5/2002 |
| JP | 3474740 | 9/2003 |
| JP | 3788982 | 4/2006 |
| JP | 3997757 | 8/2007 |

* cited by examiner

Primary Examiner — Phallaka Kik
(74) Attorney, Agent, or Firm — Finnegan, Henderson, Farabow, Garrett & Dunner, L.L.P.

(57) ABSTRACT

A graph is created in which mask patterns adjacent to one another at a distance in which desired printing resolution cannot be obtained in a lithography process among mask patterns generated based on a pattern layout design drawing are set as nodes connected to one another by edges. An odd number loop formed by an odd number of nodes is selected from closed loops. When the selected odd number loop is not isolated, based on whether a closed loop group in which a plurality of closed loops including the odd number loop are connected includes an even number loop formed by an even number of nodes, rearrangement target nodes are selected from the odd number loop included in the closed loop group according to different selection references. The layout of patterns described in the pattern layout design drawing is rearranged corresponding to the selected rearrangement target nodes.

15 Claims, 10 Drawing Sheets

CONFLICT

PATTERN LAYOUT DESIGNING METHOD, SEMICONDUCTOR DEVICE MANUFACTURING METHOD, AND COMPUTER PROGRAM PRODUCT

CROSS-REFERENCE TO RELATED APPLICATIONS

This application is based upon and claims the benefit of priority from the prior Japanese Patent Application No. 2008-316072, filed on Dec. 11, 2008; the entire contents of which are incorporated herein by reference.

BACKGROUND OF THE INVENTION

1. Field of the Invention

The present invention relates to a pattern layout designing method, a semiconductor device manufacturing method, and a computer program product.

2. Description of the Related Art

In recent years, demands for refining of semiconductor elements are increasing. To form a fine pattern on a semiconductor substrate, it is conceivable to apply double patterning technologies or phase shift mask technologies to perform photolithography.

As one of the double patterning technologies, there is a technology for splitting a photomask of one layer of LSI pattern, which is collectively exposed in a photolithography process in the past, into two photomasks and alternately exposing patterns on photomasks, which are originally adjacent to one another, twice to thereby form patterns having fine pitches that cannot be formed by performing exposure once on a semiconductor substrate. As one of the phase shift mask technologies, there is a technology for alternately arranging phase shifters in adjacent translucent patterns on a photomask to thereby alternately shift phases of lights passing through the patterns 0 degree and 180 degrees and making an intensity profile of light focused on a resist steep to improve the resolution of a pattern formed on the resist.

When the double patterning technology is applied, patterns need to be classified into a type exposed with a first photomask and a type exposed with a second photomask. When the phase shift mask technology is applied, patterns need to be classified into a type in which the phase shifters are arranged and a type in which the phase shifters are not arranged. Regardless of which of the technologies is applied, patterns need to be classified (sorted) into two types such that adjacent patterns on a photomask belong to different types. However, in principle, a section where adjacent patterns belong to the same type (a conflict) occurs. Therefore, there is a demand for a technology for detecting and removing, at a stage when a layout design drawing of a mask pattern or a design pattern (hereinafter, the mask pattern design drawing and the design pattern design drawing are collectively referred to as pattern layout design drawing) is created, a structure in which such an unclassifiable section occurs.

To meet the demand, for example, Japanese Patent No. 3307313 discloses a technology for detecting a section where an odd number of patterns are annularly arranged in a fine section (an odd number loop) and rearranging a part of patterns forming the odd number loop to remove a conflict.

However, recently, semiconductor integrated circuits are complicated. Therefore, an odd number loop connected to other loops is often formed in a fine section of a pattern of a mask layout design drawing for a photomask. In such an odd number loop connected to a plurality of loops, the number of rearrangement target patterns may increase depending on selection of rearrangement target patterns. When the number of rearrangement target patterns increases, a design load increases according to the increase. Therefore, it is important to efficiently select rearrangement target patterns such that the number of rearrangement target patterns decreases. However, Japanese Patent No. 3307313 does not disclose a method of efficiently selecting rearrangement target patterns.

BRIEF SUMMARY OF THE INVENTION

A pattern layout designing method according to an embodiment of the present invention comprises: creating a graph in which mask patterns adjacent to one another at a distance in which desired printing resolution cannot be obtained in a lithography process or a distance in which an assist pattern for obtaining the desired printing resolution cannot be arranged among mask patterns generated based on a pattern layout design drawing are set as nodes connected to one another by edges; extracting closed loops from the created graph; selecting an odd number loop formed by an odd number of nodes from the extracted closed loops, arbitrarily selecting, when the selected odd number loop is isolated, rearrangement target nodes from the odd number loop, and selecting, when the selected odd number loop is not isolated, based on whether a closed loop group in which a plurality of closed loops including the odd number loop are connected includes an even number loop formed by an even number of nodes, rearrangement target nodes from the odd number loop included in the closed loop group according to different selection references; and rearranging layout of patterns described in the pattern layout design drawing corresponding to the selected rearrangement target nodes.

A semiconductor device manufacturing method according to an embodiment of the present invention comprises: creating a graph in which mask patterns adjacent to one another at a distance in which desired printing resolution cannot be obtained in a lithography process or a distance in which an assist pattern for obtaining the desired printing resolution cannot be arranged among mask patterns generated based on a pattern layout design drawing are set as nodes connected to one another by edges; extracting closed loops from the created graph; selecting an odd number loop formed by an odd number of nodes from the extracted closed loops, arbitrarily selecting, when the selected odd number loop is isolated, rearrangement target nodes from the odd number loop, and selecting, when the selected odd number loop is not isolated, based on whether a closed loop group in which a plurality of closed loops including the odd number loop are connected includes an even number loop formed by an even number of nodes, rearrangement target nodes from the odd number loop included in the closed loop group according to different selection references; rearranging layout of patterns described in the pattern layout design drawing corresponding to the selected rearrangement target nodes; forming patterns on a semiconductor substrate based on the pattern layout design drawing in which the layout of patterns is rearranged; and manufacturing a semiconductor device from the semiconductor substrate on which the patterns are formed.

A computer program product according to an embodiment of the present invention for causing a computer to execute: creating a graph in which mask patterns adjacent to one another at a distance in which desired printing resolution cannot be obtained in a lithography process or a distance in which an assist pattern for obtaining the desired printing resolution cannot be arranged among mask patterns generated based on a pattern layout design drawing are set as nodes connected to one another by edges; extracting closed loops from the created graph; selecting an odd number loop formed by an odd number of nodes from the extracted closed loops, arbitrarily selecting, when the selected odd number loop is isolated, rearrangement target nodes from the odd number loop, and selecting, when the selected odd number loop is not isolated, based on whether a closed loop group in which a plurality of closed loops including the odd number loop are connected includes an even number loop formed by an even number of nodes, rearrangement target nodes from the odd number loop included in the closed loop group according to different selection references; and rearranging layout of patterns described in the pattern layout design drawing corresponding to the selected rearrangement target nodes.

DETAILED DESCRIPTION OF THE INVENTION

Exemplary embodiments of a pattern layout designing method, a semiconductor device manufacturing method, and a computer program product according to the present invention will be explained below in detail with reference to the accompanying drawings. The present invention is not limited to the following embodiments.

First, to facilitate understanding, a double patterning technology is explained taking, as an example a process for forming contact holes in an interlayer insulating film formed to cover a substrate on which gate electrodes are formed.

Figure 1A:
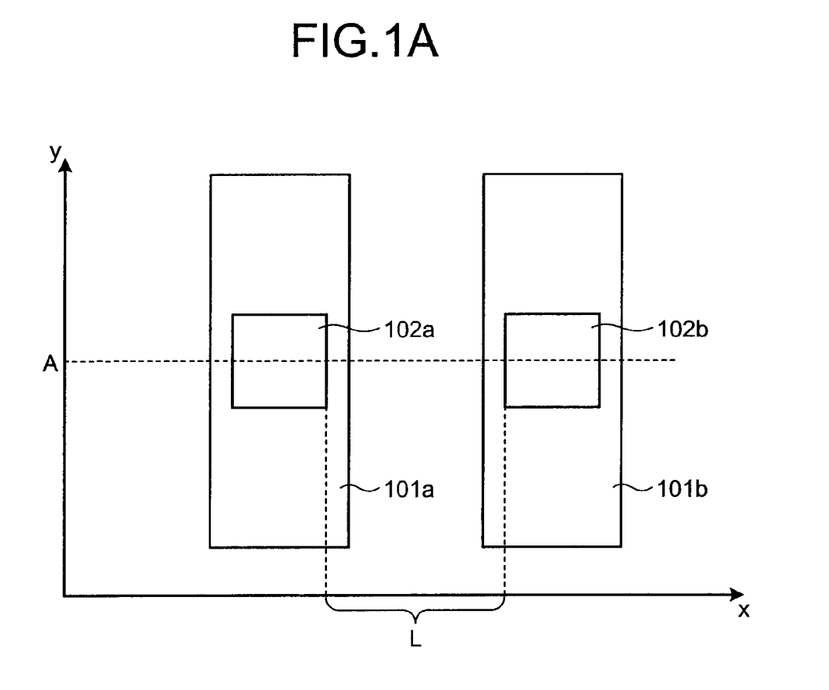
FIG. 1A is a diagram of a schematic configuration of an exposing device used for a semiconductor device manufacturing method according to a first embodiment of the present invention.
Figure 1B:
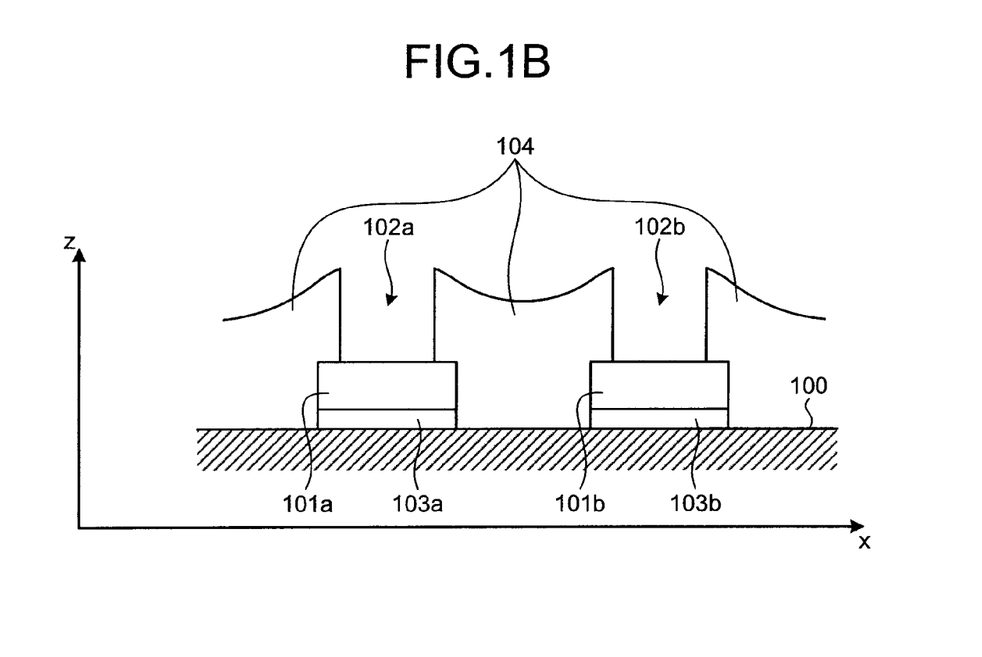
FIG. 1B is a diagram for explaining a layout of contacts.

FIG. 1A is a diagram for explaining a layout of contact holes desired to be formed viewed from above in the vertical direction (a z axis direction) with respect to the surface of a wafer. As shown in the figure, on a substrate, rectangular gate electrodes 101*a* and 101*b* are formed with a y axis direction set as a longitudinal direction thereof. Contact holes 102*a* and 102*b* are respectively arranged in positions of y=A on the gate electrodes 101*a* and 101*b*. The contact holes 102*a* and 102*b* are spaced apart a distance L from each other. FIG. 1B is a sectional view in the position of y=A of the wafer shown in the layout diagram of FIG. 1A. As shown in FIG. 1B, the gate electrodes 101*a* and 101*b* are respectively formed on gate oxide films 103*a* and 103*b* formed on a substrate 100. An interlayer insulating film 104 is formed to cover the substrate 100 together with the gate electrodes 101*a* and 101*b* formed on the substrate 100. As shown in the figure, the contact holes 102*a* and 102*b* are formed by etching the interlayer insulating film 104 from above the gate electrodes 101*a* and 101*b*. Contacts are formed by, after forming the contact holes 102*a* and 102*b*, filling a contact material in the formed contact holes 102*a* and 102*b*.

When the contact holes 102*a* and 102*b* are formed in the interlayer insulating film 104, a photolithography process and an etching process are executed. The photolithography process is a process for applying or laminating a photosensitive paste (resist) on the interlayer insulating film 104, irradiating light on the resist via a photomask in which a light blocking section and a light transmitting section are formed in predetermined patterns, hardening or resolving a region of the resist where the light transmitted through the light transmitting section is focused, dissolving and removing an unnecessary section with development, and forming contact hole patterns in the resist. The etching process is a process for performing etching with the formed contact hole patterns of the resist as a mask to thereby opening contact holes in the interlayer insulating film 104.

In an exposing device that executes photolithography, a minimum distance (hereinafter, "limit distance") in which desired printing resolution can be obtained in a lithography process is determined by the wavelength of light in use, a numerical aperture of a lens, a shape of a light source, a lithography condition, and the like. When the distance L is smaller than the limit distance, patterns for the contact holes 102*a* and 102*b* cannot be focused by exposure with one photomask. Therefore, the double patterning technology for separately exposing the patterns for the contact holes 102*a* and 102*b* using two photomasks is effective.

A process for forming the contact holes 102*a* and 102*b* in the interlayer insulating film 104 using the double patterning technology is explained. There are various methods for the double patterning technology. As an example, a method of repeating the lithography process and the etching process twice is explained with reference to FIGS. 2A to 2E.

Figure 2A:
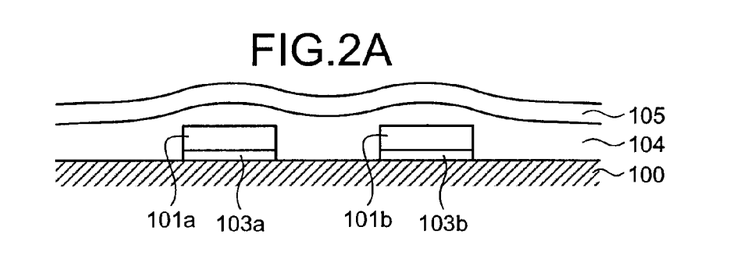
FIGS. 2A to 2E are diagrams for explaining a process for forming contacts in an interlayer insulating film using a double patterning technology.
Figure 2B:
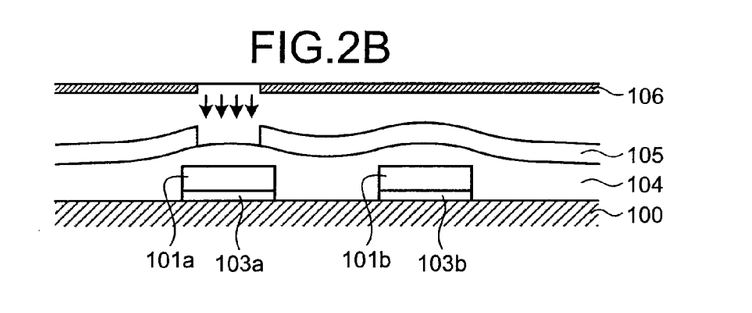
Figure 2C:
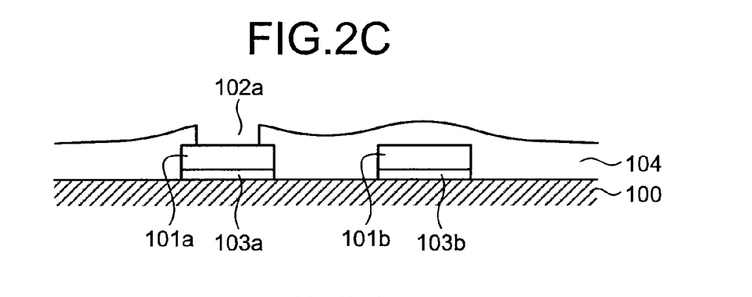

As shown in FIG. 2A, a resist film 105 is formed on the interlayer insulating film 104. Subsequently, as shown in FIG. 2B, a resist pattern for the contact hole 102*a* is formed by exposing the resist film 105 via a first photomask 106 on which a mask pattern for the contact hole 102*a* is formed and developing the exposed resist film 105. It is assumed that the resist film 105 is a positive resist from which an exposed section is removed. After etching of the interlayer insulating film 104 is performed with the formed resist pattern as a mask, the remaining resist pattern is removed. Then, as shown in FIG. 2C, the wafer in which the contact hole 102*a* is formed is obtained.

Figure 2D:
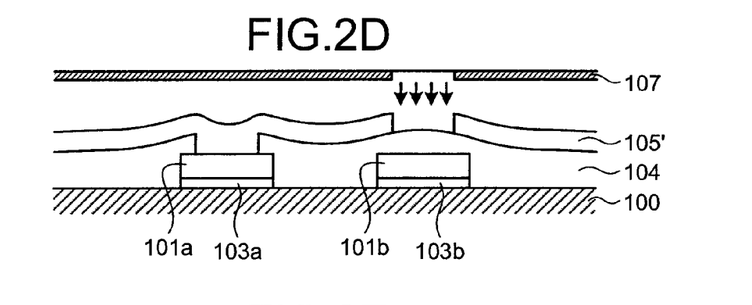
Figure 2E:
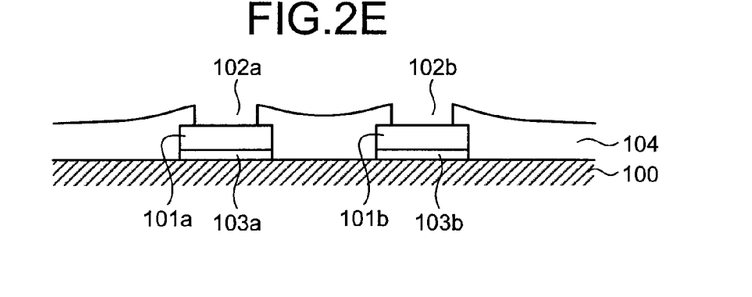

As shown in FIG. 2D, a resist material is applied again to form a resist film 105' on the interlayer insulating film 104. A resist pattern for the contact 102*b* is formed on the resist film 105' by exposing the resist film 105' via a second photomask 107 on which a mask pattern for the contact 102*b* is formed and developing the exposed resist film 105'. After etching of the interlayer insulating film 104 is performed with the formed resist pattern as a mask, the remaining resist pattern is removed. Then, as shown in FIG. 2E, the wafer in which the contact holes 102a and 102b are formed is obtained.

As a method of forming the contact hole patterns 102a and 102b according to the double patterning technology, there is a method explained below besides the method explained above. A hard mask (a nitride film, etc.) is formed on the interlayer insulating film 104. A resist is formed on the hard mask. A pattern for the contact hole 102a is formed in the resist by using the first photomask 106. After etching of the interlayer insulating film 104 is performed with the resist as a mask to print the pattern for the contact hole 102a onto the hard mask, a resist is formed on the hard mask again. A pattern for the contact hole 102b is formed on the resist by using the second photomask 107. Etching of the interlayer insulating film 104 is performed with the resist pattern as a mask to print the pattern for the contact hole 102b onto the hard mask. Finally, etching of the interlayer insulating film 104 is performed with the hard mask as a mask to form the contact holes 102a and 102b in the interlayer insulating film 104.

As explained above, according to the double patterning technology, the contact holes 102a and 102b arranged adjacent to each other at a distance smaller than the limit distance are formed by exposing the contact holes 102a and 102b using the first photomask 106 and the second photomask 107, respectively. Specifically, when the double patterning technology is used, at the time of pattern layout design for contact hole patterns for photomasks, work for classifying the contact hole patterns into two types, i.e., a type exposed by using one photomask and a type exposed by using the other photomask, is necessary such that the contact hole patterns adjacent to each other at a distance smaller than the limit distance are exposed by two separate photomasks.

Figure 3A:
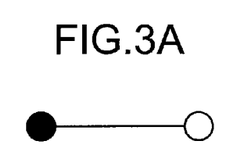
FIGS. 3A to 3C are diagrams for explaining examples of graphs.
Figure 3B:
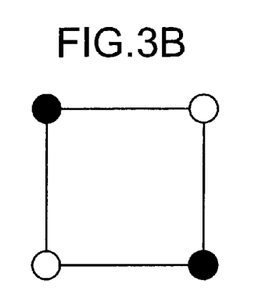
Figure 3C:
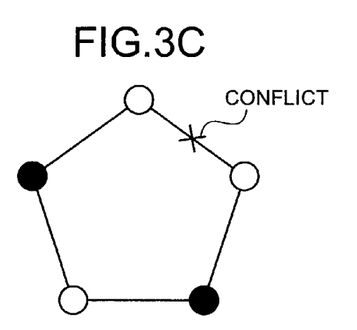

The concept of the theory of graphs is introduced to represent a contact hole pattern, a distance from which to an adjacent contact hole pattern is smaller than the limit distance, as a node and represent a relation between the contact hole pattern and the adjacent contact hole pattern as an edge. Then, the work for classifying the contact hole patterns into the two types results in a problem of classifying nodes into two types such that nodes on both sides of each edge belong to different types. FIGS. 3A to 3C are diagrams of examples of graphs formed by nodes and edges. In FIGS. 3A to 3C, nodes classified into a first type are drawn as black circles and nodes classified into a second type are drawn as white circles.

When the contact holes 102a and 102b explained above are formed, because two nodes are simply connected by one edge, it is easy to classify the two nodes into the two types. Specifically, as shown in FIG. 3A, it is sufficient to classify any one of the nodes into the first type and classify the other node into the second type. When an even number of nodes form a closed loop, as indicated by a graph formed by four nodes shown in FIG. 3B, nodes adjacent to one another can be classified into the first type and the second type such that the nodes belong to different types. However, as indicated by a graph formed by five nodes shown in FIG. 3C, when an odd number of nodes form a closed loop, in principle, a section in which nodes located on both sides of an edge are classified into the same type (a conflict) occurs. When the conflict occurs in this way, the resolution of contact hole patterns corresponding to the conflicting nodes falls. The contact hole patterns cannot be formed on a wafer as intended.

With a pattern layout designing apparatus according to the first embodiment, a graph is formed from a mask layout design drawing of contact hole patterns, a closed loop structure including an odd number of nodes is detected, and a layout of the contact hole patterns is efficiently rearranged to remove an odd number loop structure that causes a conflict. The pattern layout designing apparatus according to the first embodiment is explained below.

Figure 4:
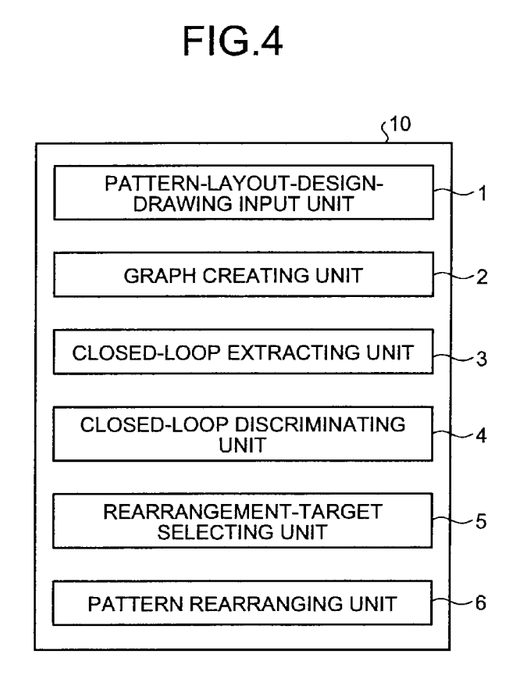
FIG. 4 is a block diagram of a configuration of a pattern layout designing apparatus according to the first embodiment.

FIG. 4 is a block diagram for explaining a configuration of the pattern layout designing apparatus. As shown in FIG. 4, a pattern layout designing apparatus 10 includes a pattern-layout-design-drawing input unit 1 that receives the input of a pattern layout design drawing of contact hole patterns, a graph creating unit 2 that extracts contact hole patterns, distances from which to adjacent holes are smaller than the limit distance, in a photomask generated based on the pattern layout design drawing received by the pattern-layout-design-drawing input unit 1 and creates a graph in which the contact hole patterns adjacent to one another at the distance smaller than the limit distance are set as nodes connected by edges, a closed-loop extracting unit 3 that extracts nodes and edges forming closed loops from the graph created by the graph creating unit 2, a closed-loop discriminating unit 4 that discriminates the closed loops extracted by the closed-loop extracting unit 3 into closed loops formed by an odd number of nodes (odd number loops) and closed loops formed by an even number of nodes (even number loops), a rearrangement-target selecting unit 5 that selects rearrangement target nodes to remove the odd number loops discriminated by the closed-loop discriminating unit 4, and a pattern rearranging unit 6 that rearranges contact hole patterns corresponding to the nodes selected by the rearrangement-target selecting unit 5.

The pattern layout designing apparatus 10 according to this embodiment includes a control device such as a central processing unit (CPU), storage devices such as a read only memory (ROM) and a random access memory (RAM), a hard disk (HD), an external storage device such as a compact disk (CD) drive device, a display device such as a display, and input devices such as a keyboard and a mouse. The pattern layout designing apparatus 10 has a hardware configuration employing a normal computer.

A pattern layout designing program as a computer program product executed by the pattern layout designing apparatus 10 according to the first embodiment is provided while being recorded in computer-readable recording media such as a compact disk-read only memory (CD-ROM), a flexible disk (FD), a compact disk-recordable (CD-R), and a digital versatile disk (DVD) as a file of an installable format or an executable format.

The pattern layout designing program executed by the pattern layout designing apparatus 10 according to the first embodiment can be provided by being stored on a computer, which is connected to a network such as the Internet, and downloaded through the network. The pattern layout designing program executed by the pattern layout designing apparatus 10 according to the first embodiment can be provided or distributed through the network such as the Internet. The pattern layout designing program executed by the pattern layout designing apparatus 10 according to the first embodiment can be incorporated in a ROM and the like in advance and provided.

The pattern layout designing program executed by the pattern layout designing apparatus 10 according to the first embodiment has a module configuration including the units explained above (the pattern-layout-design-drawing input unit 1, the graph creating unit 2, the closed-loop extracting unit 3, the closed-loop discriminating unit 4, the rearrangement-target selecting unit 5, and the pattern rearranging unit 6). The pattern layout designing program is loaded onto a main storage device and the pattern-layout-design-drawing input unit 1, the graph creating unit 2, the closed-loop extracting unit 3, the closed-loop discriminating unit 4, the rearrangement-target selecting unit 5, and the pattern rearranging unit 6 are generated on the main storage device.

Figure 5:
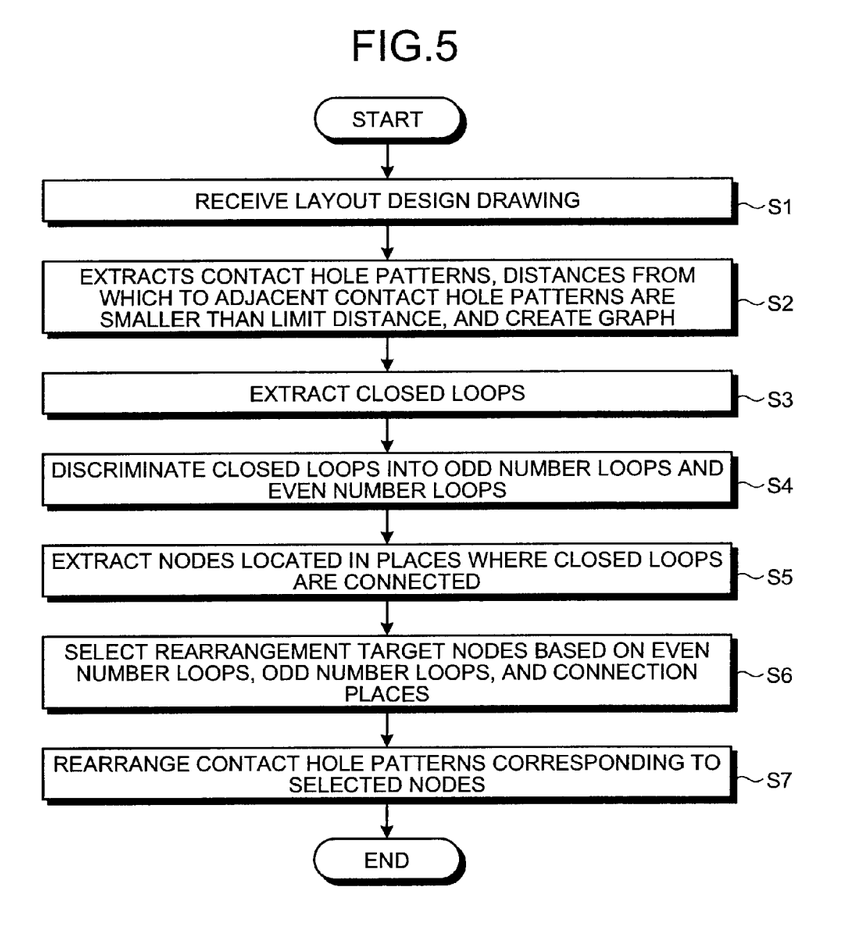
FIG. 5 is a flowchart for explaining the operation of the pattern layout designing apparatus according to the first embodiment.

FIG. 5 is a flowchart for explaining the operation of the pattern layout designing apparatus 10 according to the first embodiment. As shown in FIG. 5, first, the pattern-layout-design-drawing input unit 1 receives a pattern layout design drawing input thereto (step S1). The pattern layout design drawing input to the pattern-layout-design-drawing input unit 1 can be a design drawing rendered by a computer aided design (CAD) or the like.

The graph creating unit 2 interprets the received pattern layout design drawing. The graph creating unit 2 extracts contact hole patterns, distances from which to adjacent contact hole patterns is smaller than the limit distance, in a photomask generated based on the pattern layout design drawing and creates a graph in which the contact hole patterns adjacent to one another at the distances smaller than the limit distance are set as nodes connected to one another by edges (step S2). The closed-loop extracting unit 3 extracts closed loops from the created graph (step S3).

Figure 6:
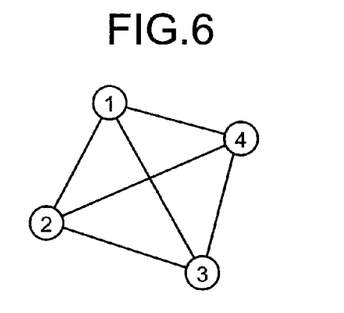
FIG. 6 is a diagram for explaining an example of rules for closed loop extraction.

An example of rules for closed loop extraction by the closed-loop extracting unit 3 is explained with reference to FIG. 6. The closed-loop extracting unit 3 extracts, as closed loops, minimum unit structures in a closed structure connected by nodes and edges. The closed-loop extracting unit 3 extracts the closed loops such that areas sectioned by the edges forming closed loops do not partially or entirely overlap each other. In the graph shown in FIG. 6, nodes 1 to 4 are connected to one another by edges indicated by straight lines. In this case, a triangular structure formed by the nodes 1, 2, and 3, a triangular structure formed by the nodes 1, 3, and 4, a triangular structure formed by the nodes 2, 3, and 4, and a triangular structure formed by the nodes 1, 2, and 4 are minimum unit structures. Therefore, because a square structure formed by the nodes 1, 2, 3, and 4 is not a minimum unit structure, the closed-loop extracting unit 3 does not extract the square structure as a closed loop. As a triangular structure including the nodes 1 and 2, two kinds of triangular structures, i.e., the triangular structure formed by the nodes 1, 2, and 3 and the triangular structure formed by the nodes 1, 2, and 4 can be adopted. However, in the two kinds of triangular structures, areas of the two triangular structures partially overlap. Therefore, the closed-loop extracting unit 3 does not extract both the triangular structures as closed loops. In other words, the closed-loop extracting unit 3 extracts, from the graph shown in FIG. 6, both the triangular structure formed by the nodes 1, 2, and 3 and the triangular structure formed by the nodes 1, 3, and 4 as closed loops or extracts both the triangular structure formed by the nodes 2, 3, and 4 and the triangular structure formed by the nodes 1, 2, and 4 as closed loops.

At step S2, two contact hole patterns arranged at a distance smaller than the limit distance are extracted by the graph creating unit 2 and connected to each other by an edge even when another contact hole pattern is arranged on a straight line that connects the two contact hole patterns. For example, when three contact hole patterns are arranged on one straight line and arranged at distances smaller than the limit distance from one another, the three contact hole patterns are connected to one another by edges and extracted as a closed loop at step S3.

Referring back to FIG. 5, following step S3, the closed-loop discriminating unit 4 discriminates the extracted closed loops into odd number loops and even number loops (step S4). The closed-loop discriminating unit 4 extracts nodes located in places where a plurality of closed loops are connected to one another (nodes in connecting places) (step S5). For example, when the closed-loop extracting unit 3 extracts both the triangular structure formed by the nodes 1, 2, and 3 and the triangular structure formed by the nodes 1, 3, and 4 as closed loops from the graph shown in FIG. 6, the two triangular structures are connected by a side formed by the node 1 and the node 3. Therefore, at step S5, the closed-loop discriminating unit 3 extracts the node 1 and the node 3 as the nodes in connecting places.

Figure 7:
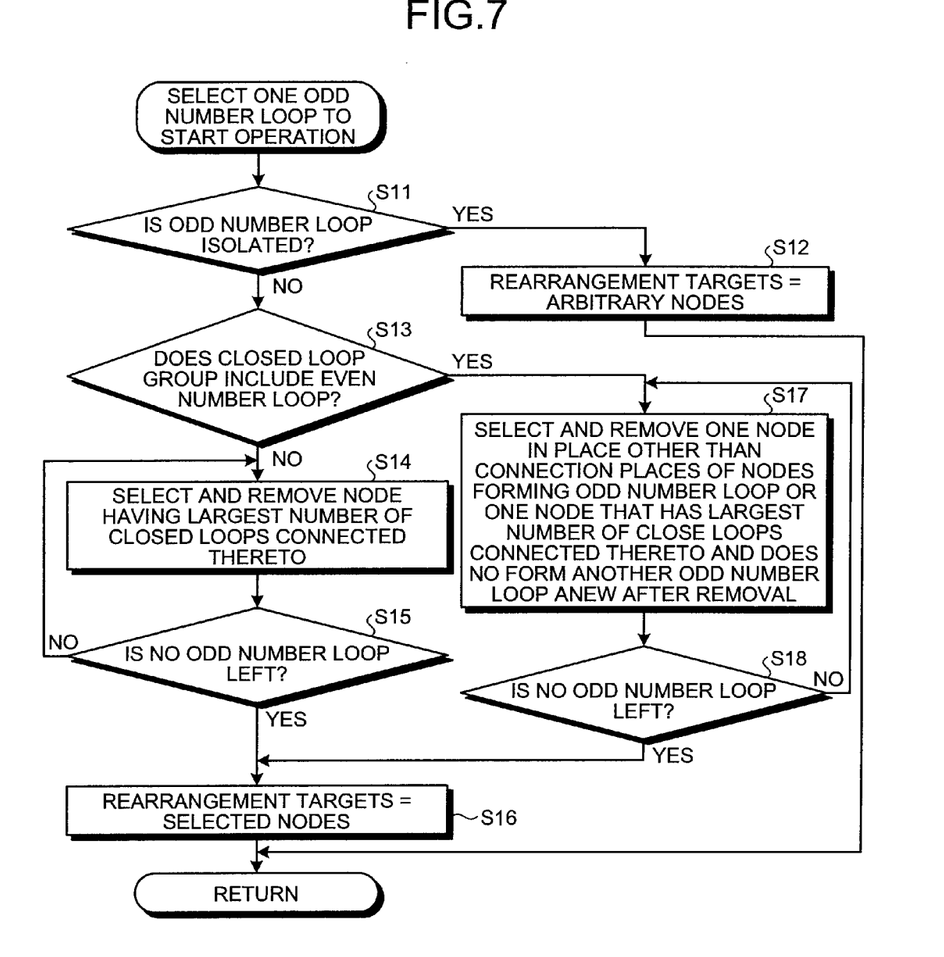
FIG. 7 is a flowchart for explaining the operation of a rearrangement-target selecting unit in detail.

At step S5, the rearrangement-target selecting unit 5 selects, based on the discriminated even number loops and odd number loops and the nodes in connecting places, rearrangement target nodes to remove the odd number loops (step S6). FIG. 7 is a flowchart for explaining the operation of the rearrangement-target selecting unit 5 at step S6 more in detail.

In FIG. 7, first, the rearrangement-target selecting unit 5 selects one odd number loop to start operation. The rearrangement-target selecting unit 5 determines whether the selected odd number loop is isolated (step S11). The rearrangement-target selecting unit 5 can easily determine, by checking whether at least one of the nodes in connecting places extracted at step S5 is present in nodes included in the odd number loop, whether the odd number loop is isolated.

When the rearrangement-target selecting unit 5 determines that the selected isolated loop is isolated ("Yes" at step S11), the rearrangement-target selecting unit 5 selects, as rearrangement targets, arbitrary nodes among the nodes forming the odd number loops (step S12).

When the selected odd number loop is connected to another closed loop and is not an isolated closed loop ("No" at step S11), the rearrangement-target selecting unit 5 traces closed loops, which have a connection relation with the selected odd number loop, such as a closed loop connected to the selected odd number loop and another closed loop connected to the closed loop. The rearrangement-target selecting unit 5 determines whether an even number loop is present in a closed loop group formed by the selected odd number loop and the closed loop having connection relations, regardless of directly or indirectly, with the odd number loop (step S13). When an even number loop is not present, i.e., when the closed loop group includes odd number loops ("No" at step S13), the rearrangement-target selecting unit 5 lists all nodes forming the closed loop group, selects a node having a largest number of closed loops connected thereto, and once removes the selected node (step S14). The rearrangement-target selecting unit 5 determines whether no odd number loop is left in the remaining nodes (step S15). The rearrangement-target selecting unit 5 repeats step S14 until all the odd number loops are removed. When no odd number loop is left ("Yes" at step S15), the rearrangement-target selecting unit 5 sets all the nodes selected at step S14 as rearrangement targets (step S16).

Figure 8A:
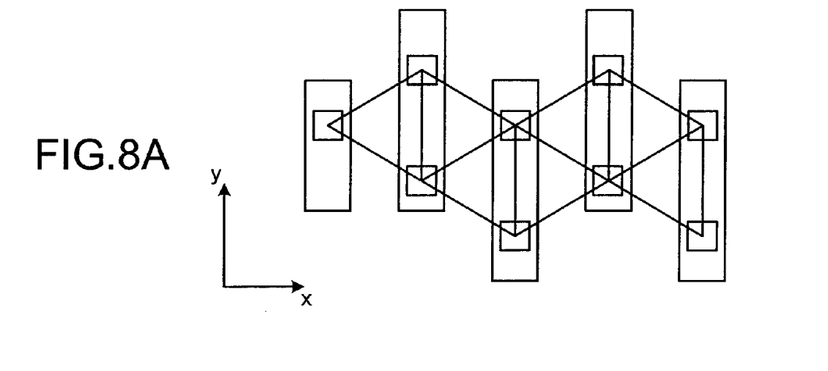
FIGS. 8A to 8D are diagrams for explaining a state in which rearrangement target nodes are selected.
Figure 8B:
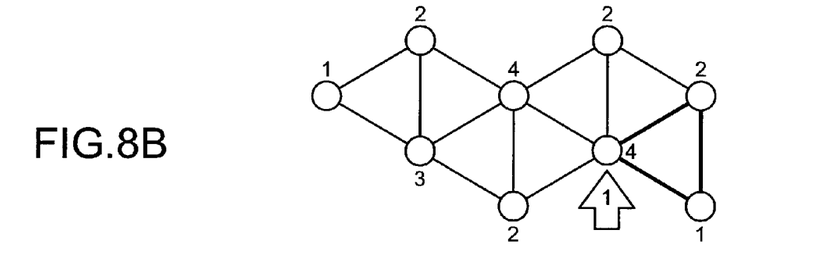
Figure 8C:
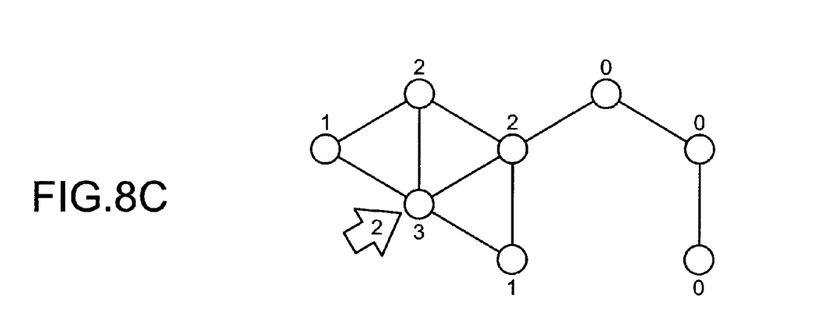
Figure 8D:
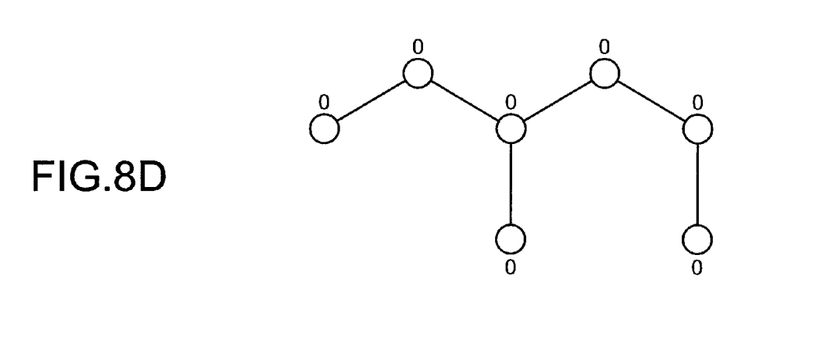

FIGS. 8A to 8D are diagrams for explaining a state in which the rearrangement target nodes are selected and the odd number loops are removed according to the operation at steps S14, S15, and S16. Gate electrodes and contacts are laid out as shown in FIG. 8A. Distances among the contacts indicated by solid lines are smaller than the limit distance. Contact hole patterns laid out in this way are represented by nodes and edges as shown in FIG. 8B. Numbers around the nodes indicate the number of closed loops connected to the respective nodes. For example, four closed loops having the triangular structure are connected to a node indicated by a white arrow (1). When an odd number loop of a triangle indicated by a thick solid line shown in FIG. 8B is selected by the rearrangement-target selecting unit 5 at the start, all nodes shown in FIG. 8B are listed as nodes forming a closed loop group including the odd number loop. Then, first, one of two nodes with a number "4" in the figure is set as a selection target. When a node indicated by the white arrow (1) in the figure is selected, the selected node is removed and the nodes and the edges shown in FIG. 8C are left. However, three odd number loops are still left. Therefore, a node with a number "3" indicated by a white arrow (2) in the figure is further selected. When the node is removed, the nodes and the edges shown in FIG. 8D are left. Consequently, the structure of the odd number loops is completely removed from the closed loop group shown in FIG. 8B. All the nodes selected and removed in the states shown in FIGS. 8B to 8D are set as rearrangement-target nodes.

Referring back to FIG. 7, when the rearrangement-target selecting unit 5 determines at step S13 that an even number loop is included in the closed loop group ("Yes" at step S13), the rearrangement-target selecting unit 5 lists the nodes forming the closed loop group. The rearrangement-target selecting unit 5 selects and removes one node in a place other than connecting places with other closed loops among nodes forming odd number loops included in the closed loop group or one node that has a largest number of closed loops connected thereto and whose removal does not cause creation of a new odd number loop among nodes in the connecting places (step S17). The rearrangement-target selecting unit 5 determines whether no odd number loop is left in the remaining nodes (step S18). The rearrangement-target selecting unit 5 repeats the operation at step S17 until all the odd number loops are removed from the closed loop group. When all the odd number loops are removed ("Yes" at step S18), the rearrangement-target selecting unit 5 sets, as rearrangement target nodes, the nodes selected until all the odd number loops are removed (step S16).

Figure 9A:
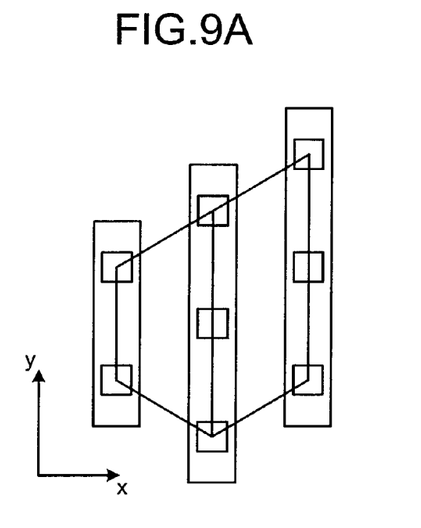
FIGS. 9A to 9D are diagrams for explaining a state in which rearrangement target nodes are selected.
Figure 9B:
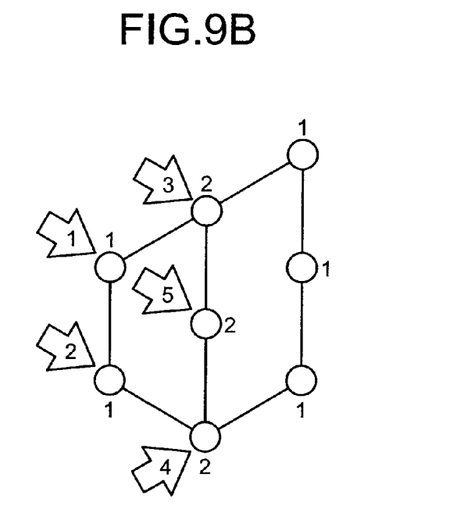
Figure 9C:
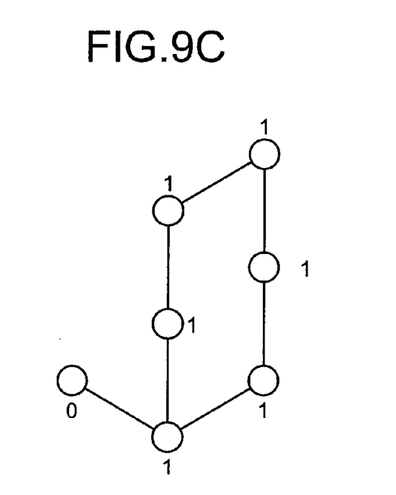
Figure 9D:
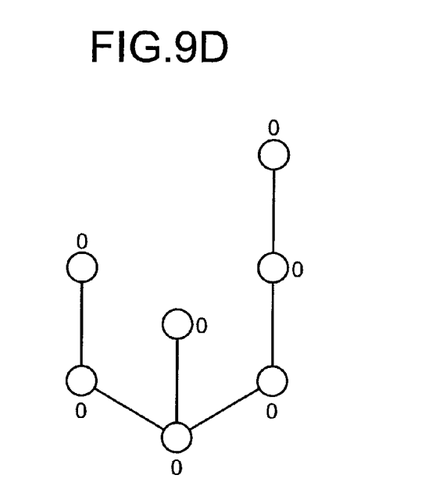

FIGS. 9A to 9D are diagrams for explaining a state in which the rearrangement target nodes are selected and the odd number loops are removed according to the operation at steps S17, S18, and S16. Contacts are laid out on gate electrodes as shown in FIG. 9A. Distances among contacts connected by solid lines are smaller than the limit distance. Contact hole patterns laid out in this way are represented by nodes and edges as shown in FIG. 9B. In a graph shown in FIG. 9B, one odd number loop and one even number loop are connected. The node in a place other than connecting places with other closed loops among nodes forming the odd number loop corresponds to nodes indicated by arrows (1) and (2) in the figure. The node that has a largest number of closed loops connected thereto and an original odd number loop of which does not combine with another closed loop and form another add number loop even if the node is removed corresponds to nodes indicated by arrows (3) and (4). For example, when the node indicated by the white arrow (1) is selected and removed, as shown in FIG. 9C, the odd number loop is removed. For example, when the node indicated by the white arrow (3) is selected and removed, as shown in FIG. 9D, the odd number loop is removed. In this way, in the case of a layout drawing shown in FIG. 9A, one of the nodes indicated by the white arrows (1) to (4) is selected as a rearrangement target node.

As explained above, when the selected odd number loop is an isolated odd number loop, the rearrangement-target selecting unit 5 selects arbitrary nodes among nodes forming the odd number loop as rearrangement targets. When the selected odd number loop is an odd number loop included in a closed loop group, the rearrangement-target selecting unit 5 selects, based on whether the closed loop group includes an even number loop, rearrangement target nodes from nodes forming the odd number loop. The rearrangement-target selecting unit 5 sequentially selects odd number loops included in the graph and selects the rearrangement target nodes.

Referring back to FIG. 5, following step S6, the pattern-rearranging unit 6 rearranges contact hole patterns corresponding to the rearrangement target nodes selected by the rearrangement-target selecting unit 5 (step S7). The rearrangement indicates that the contact hole patterns are removed, the contact hole patterns are combined with adjacent contact hole patterns, or a limitation on a space is relaxed to increase distances to adjacent contact hole patterns to be equal to or larger than the limit distance. A design layout of contact holes can be designed by rearranging the contact hole patterns. A mask pattern layout can be designed based on the designed design layout.

Figure 10:
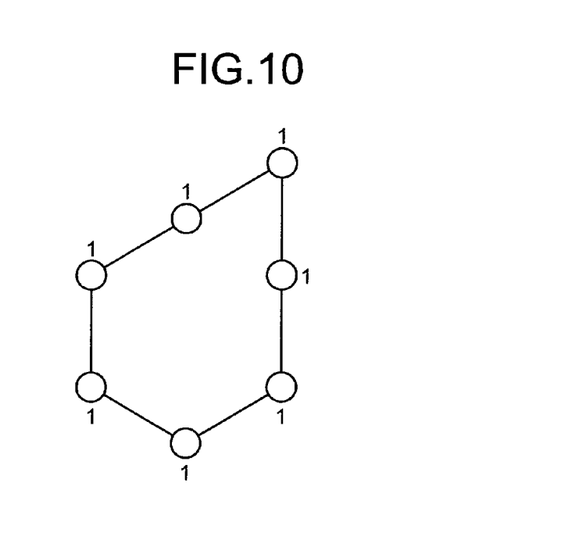
FIG. 10 is a diagram for explaining an odd number loop formed anew.

In this way, the pattern layout designing apparatus 10 detects, from a pattern layout drawing of contact hole patterns designed by a designer, a structure in which a conflict occurs when a photomask is split into two photomasks and executes rearrangement of the contact hole patterns to remove the structure. For example, according to a technology for selecting rearrangement target contact hole patterns such as the technology disclosed in Japanese Patent No. 3307313, if nodes in places other than connecting places are selected as rearrangement targets in a group of seven closed loops having the triangular structure in which odd number nodes are connected, seven rearrangement target nodes have to be selected. When a node indicated by a white arrow (5) is selected as a rearrangement target in the graph shown in FIG. 9B, a new odd number loop shown in FIG. 10 is formed by the remaining nodes. Therefore, it is necessary to select one more node as a rearrangement target. In other words, when rearrangement target nodes are arbitrarily selected, in some case, the number of rearrangement target nodes increase. The pattern layout designing apparatus 10 according to the first embodiment can reduce the number of contact hole patterns selected as rearrangement targets by selecting, based on whether a closed loop group includes an even number loop, rearrangement target nodes from nodes forming an odd number loop. In other words, it is possible to efficiently select rearrangement target contact hole patterns and remove a section where a conflict occurs.

In the example explained above, the contact hole patterns are rearranged in the pattern layout design drawing for forming contact hole patterns on the interlayer insulating film. However, the pattern layout designing apparatus 10 according to the first embodiment can execute rearrangement for any pattern layout design drawing as long as it is likely that patterns are laid out at intervals smaller than the limit distance in the pattern layout design drawing. According to the first embodiment, the pattern layout design drawing is corrected to remove the section where a conflict occurs. Therefore, the first embodiment can be used for generating a pattern layout design drawing for applying the double patterning technology and used for correcting the pattern layout design drawing to apply the double patterning technology.

In the above explanation, when there are a plurality of nodes having a largest number of closed loops connected thereto at step S14, there is no reference concerning which node among the nodes is selected and removed. However, the nodes can be selected and removed in any way. For example, in the above explanation, in the case of FIG. 8B, the node indicated by the white arrow (1) is selected first. However, another node to which four closed loops are connected can be selected. If the node is selected first, at step S16, three nodes are set as rearrangement target nodes. The number of rearrangement target nodes increases by one compared with the number of rearrangement target nodes that are set when the white arrow (1) is selected. However, compared with the technology with which it is likely to select seven rearrangement target nodes such as the technology disclosed in Japanese Patent No. 3307313, it can be said that the number of rearrangement target nodes can still be held down. When there are a plurality of nodes having a largest number of closed loops connected thereto, to finally minimize the number of rearrangement target nodes, the rearrangement-target selecting unit 5 can execute the operation at steps S14 to S16 when the nodes are selected first and select a removal method in which the number of rearrangement target nodes is the smallest.

Similarly, at step S17, the rearrangement-target selecting unit 5 can select, in whichever way, a node in a place other than connecting places with other closed loops among nodes forming odd number loops included in the closed loop group or a node that has a largest number of closed loops connected thereto and does not form an odd number loop anew after the removal among nodes in the connecting places.

When contact hole patterns are combined, the pattern rearranging unit 6 can select and combine contact hole patterns located on the same gate electrode among contact hole patterns adjacent to one another at distances smaller than the limit distance. When there are contact hole patterns located on the same gate electrode among the contact hole patterns adjacent to one another at distances smaller than the limit distance, the pattern rearranging unit 6 can remove rearrangement target contact hole patterns or relax a limitation on a distance between the contact hole patterns and adjacent contact hole patterns.

With the phase shift mask technology, phase shifters are alternately arranged in adjacent translucent patterns at a distance smaller than the limit distance, whereby phases of lights passing through the patterns are alternately shifted 0 degree and 180 degrees. When a section where two translucent patterns having the same phase of transmitted light are adjacent to each other at a distance smaller than the limit distance occurs, the resolution of a resist image corresponding to this section is deteriorated. In other words, when the phase shift mask technology is applied, work for classifying mask patterns into a type in which the phase shifter is arranged and a type in which the phase shifter is not arranged is necessary. In classifying the mask patterns, it is necessary to classify the mask patterns such that mask patterns adjacent to each other at a distance smaller than the limit distance belong to different types. Therefore, the first embodiment can also be used for setting translucent mask patterns adjacent to each other at a distance smaller than the limit distance as nodes and setting a relation between the nodes as an edge to thereby rearrange the translucent patterns to eliminate a conflict in a pattern layout design drawing for which the phase shift mask technology is used. Further, the first embodiment can also be used for generating a pattern layout design drawing for applying the phase shift mask technology and used for correcting the pattern layout design drawing to apply the phase shift mask technology.

As explained above, according to the first embodiment, a graph in which patterns adjacent to one another at distances in which the patterns cannot be resolved are connected to one another by edges is created based on the pattern layout design drawing. In an odd number loop included in a closed loop group in which a plurality of closed loops in the graph are connected, rearrangement target nodes are selected out of nodes forming the odd number loop based on whether the closed loop group includes an even number loop and according to different selection references. Patterns corresponding to the selected nodes are rearranged. Therefore, it is possible to efficiently select rearrangement target patterns. More specifically, when an even number loop is not included in the closed loop group, the operation for removing a node having a largest number of closed loops connected thereto is repeated until no odd number loop is left in the closed loop group. When an even number loop is included in the closed loop group, the operation for removing a node not located in connecting places with other closed loops among nodes forming the odd number loop included in the closed loop group or a node having a largest number of closed loops connected thereto among nodes located in the connecting places excluding nodes that form another odd number loop anew after the removal is repeated until no odd number loop is left in the closed loop group. All the nodes removed from the closed loop group are selected as rearrangement targets. Therefore, it is possible to reduce the number of rearrangement target patterns.

In recent years, to accurately expose a mask pattern of a photomask, a method of adding an assist pattern called sub resolution assist feature (SRAF) to the photomask is used. The SRAF is often arranged to surround the mask pattern in a position away from the mask pattern by a fixed distance determined according to the wavelength of light in use, a numerical aperture of a lens, a shape of a light source, a lithography condition, and the like. The SRAF is small compared with a mask pattern desired to be actually formed and is not resolved during exposure. However, when the mask pattern around which the SRAF is provided is exposed, the SRAF eliminates fluctuation and the like of a contour of the mask pattern to enable highly accurate printing.

Figure 11:
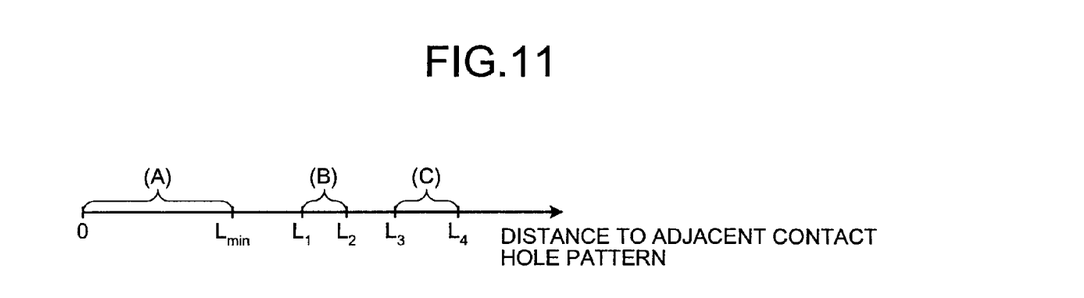
FIG. 11 is a diagram for explaining a distance between adjacent contact hole patterns.
Figure 12A:
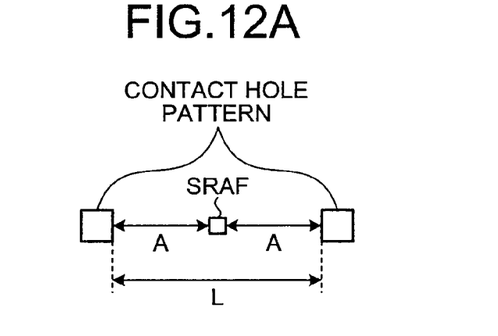
FIGS. 12A and 12B are diagrams for explaining a method of arranging an SRAF(s)
Figure 12B:
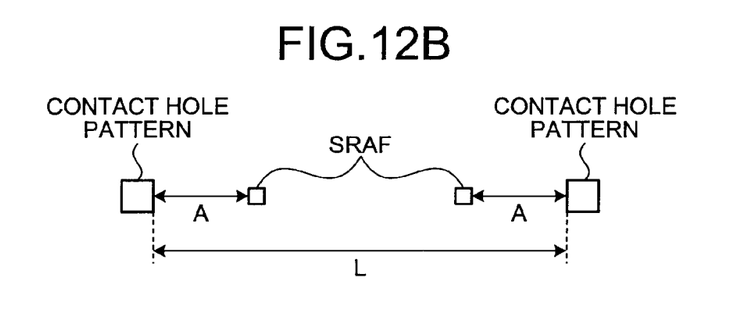

Addition of an SRAF to a pattern layout design drawing of contact hole patterns is explained. FIGS. 11 and 12A and 12B are diagrams for explaining a limitation concerning the arrangement of the contact hole patterns and the SRAF.

In FIG. 11, when a distance between the contact hole patterns is smaller than the limit distance (Lmin) (in the case of an area (A)), as explained in the first embodiment, both the contact hole patterns are not resolved at desired printing resolution. Therefore, when the double patterning technology is applied, the contact hole patterns are split into two photomasks separately.

When the distance between the contact hole patterns exceeds Lmin, the contact hole patterns can be resolved. However, when the distance exceeds a certain distance L1 (Lmin<L1), the resolution falls and the arrangement of the SRAF is necessary to obtain the desired printing resolution. As a method of arranging an SRAF(s) for two contact hole patterns that are away from each other by a distance equal to or larger than L1, two arrangement method explained below are conceivable. A first arrangement method is a method of arranging one SRAF between the contact hole patterns as shown in FIG. 12A to improve the resolution of the two contact hole patterns with one SRAF. A second arrangement method is a method of arranging one SRAF for each of the contact hole patterns as shown in FIG. 12B when a distance between the two contact hole patterns are larger.

However, as explained above, an optimum distance (a distance A shown in FIGS. 12A and 12B) from the contact hole patterns for which the SRAF(s) is (are) arranged is determined. An intended effect is not obtained when a distance between the SRAF(s) and the contact hole patterns is either too smaller or too larger than the optimum distance. A minimum distance necessary between the SRAFs is also determined. Therefore, the first and second arrangement methods cannot be used depending on a distance between the contact hole patterns. When a distance between the contact hole patterns is smaller than L2 in FIG. 11, the distance between the contact hole patterns is too small and a distance necessary between the SRAF(s) and the contact hole patterns cannot be secured. Therefore, the first arrangement method cannot be adopted. In a range of L1 to L2 (an area (B) shown in the figure), the arrangement of the SRAF(s) is necessary. However, because the first arrangement method cannot be adopted, the SRAF(s) cannot be arranged in the area. In an area of L2 to L3, the first arrangement method can be adopted and the improvement of the resolution of the two contact hole patterns can be expected. In a range of L3 to L4 (an area (C) in the figure), the distance between the two contact hole patterns is too large to adopt the first arrangement method and is too small to adopt the second arrangement method. Therefore, the arrangement of the SRAF(s) is impossible. When the distance exceeds L4, the second arrangement method can be adopted.

Even when the distance between the contact hole patterns is included in a range of the area (B) and the area (C), the application of the double patterning technology is effective. Specifically, the two contact hole patterns are split into separate photomasks and the SRAFs are separately added to the split contact hole patterns, respectively. This makes it possible to expose the photomasks at high resolution.

Figure 13:
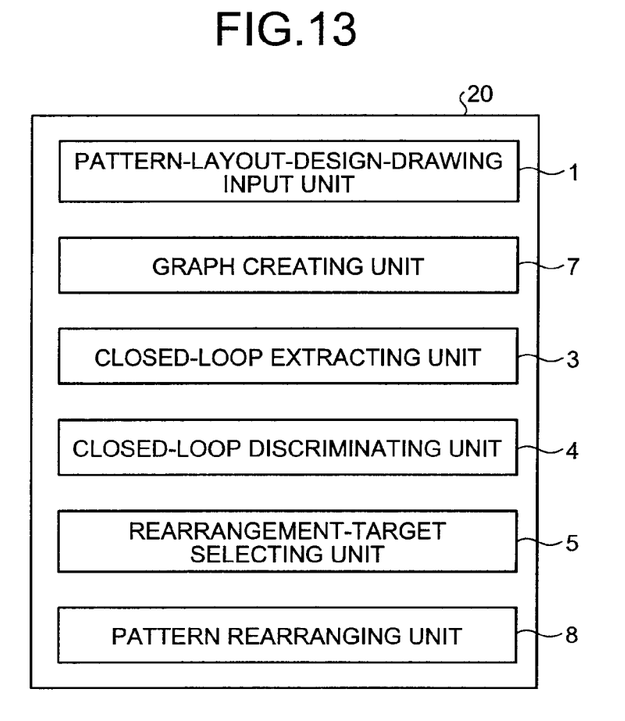
FIG. 13 is a block diagram of a configuration of a pattern layout designing apparatus according to a second embodiment of the present invention.

With a pattern layout designing method according to a second embodiment of the present invention, contact hole patterns, distances from which to adjacent contact hole patterns are included in the area (A), the area (B), and the area (C), are extracted. The contact hole patterns in a pattern layout design drawing can be rearranged such that the contact hole patterns and the contact hole patterns adjacent thereto can be split into separate photomasks and exposed by the separate photomasks. FIG. 13 is a block diagram for explaining a configuration of a pattern layout designing apparatus according to the second embodiment. Components in the second embodiment same as those in the first embodiment are denoted by the same reference numerals and signs and detailed explanation of the components is omitted.

In FIG. 13, a pattern layout designing apparatus 20 according to the second embodiment includes the pattern-layout-design-drawing input unit 1, a graph creating unit 7, the closed-loop extracting unit 3, the closed-loop discriminating unit 4, the rearrangement-target selecting unit 5, and a pattern rearranging unit 8.

The graph creating unit 7 extracts, from a pattern layout design drawing received by the pattern-layout-design-drawing input unit 1, contact hole patterns adjacent to one another at distances included in a plurality of predetermined ranges in which an assist pattern cannot be arranged in a photomask, i.e., contact hole patterns, distances from which to adjacent contact hole patterns are included in the area (A), the area (B), and the area (C). The graph creating unit 7 creates a graph in which the extracted contact hole patterns are set as nodes and relations among the nodes adjacent to one another at the distances in the area (A), the area (B), and the area (C) are set as edges.

The pattern layout designing apparatus 20 according to the second embodiment includes a control device such as a central processing unit (CPU), storage devices such as a read only memory (ROM) and a random access memory (RAM), a hard disk (HD), an external storage device such as a compact disk (CD) drive device, a display device such as a display, and input devices such as a keyboard and a mouse. The pattern layout designing apparatus 20 has a hardware configuration employing a normal computer. The pattern layout is a design layout or a mask pattern layout.

A pattern layout designing program as a computer program product executed by the pattern layout designing apparatus 20 according to the second embodiment is provided while being recorded in computer-readable recording media such as a compact disk-read only memory (CD-ROM), a flexible disk (FD), a compact disk-recordable (CD-R), and a digital versatile disk (DVD) as a file of an installable format or an executable format.

The pattern layout designing program executed by the pattern layout designing apparatus 20 according to the second embodiment can be provided by being stored on a computer, which is connected to a network such as the Internet, and downloaded through the network. The pattern layout designing program executed by the pattern layout designing apparatus 20 according to the second embodiment can be provided or distributed through the network such as the Internet. The pattern layout designing program executed by the pattern layout designing apparatus 20 according to the second embodiment can be incorporated in a ROM and the like in advance and provided.

The pattern layout designing program executed by the pattern layout designing apparatus 20 according to the second embodiment has a module configuration including the units explained above (the pattern-layout-design-drawing input unit 1, the graph creating unit 7, the closed-loop extracting unit 3, the closed-loop discriminating unit 4, the rearrangement-target selecting unit 5, and the pattern rearranging unit 8). The pattern layout designing program is loaded onto a main storage device and the pattern-layout-design-drawing input unit 1, the graph creating unit 7, the closed-loop extracting unit 3, the closed-loop discriminating unit 4, the rearrangement-target selecting unit 5, and the pattern rearranging unit 8 are generated on the main storage device.

Figure 14A:
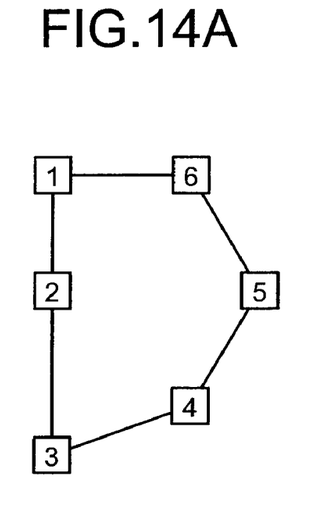
FIGS. 14A and 14B are diagrams for explaining examples of graphs.
Figure 14B:
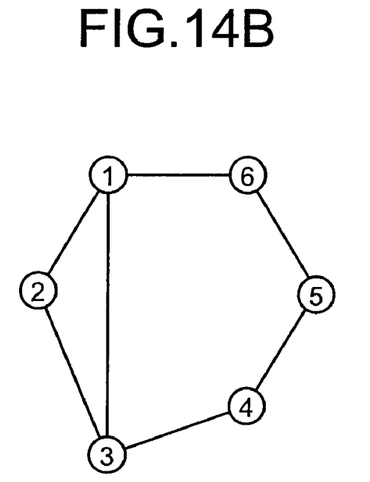

FIGS. 14A and 14B are diagrams for explaining examples of graphs created by the graph creating unit 7. FIG. 14A is a diagram of an example of a pattern layout design drawing in which contact hole patterns 1 to 6 are arranged. Illustration of gate electrodes is omitted in FIG. 14A. In the design drawing shown in FIG. 14A, a distance between the contact hole patterns 1 and 2, a distance between the contact hole patterns 2 and 3, a distance between the contact hole patterns 3 and 4, a distance between the contact hole patterns 4 and 5, a distance between the contact hole patterns 5 and 6, and a distance between the contact hole patterns 6 and 1 are included in the area (A). A distance between the contact hole patterns 1 and 3 is included in the area (C).

FIG. 14B is a graph created from the pattern layout design drawing shown in FIG. 14A by the graph creating unit 7. Numbers attached to nodes correspond to the numbers of the contact hole patterns shown in FIG. 14A in a one-to-one relation. As shown in FIG. 14B, the contact hole patterns 1, 2, and 3 are arranged on the same straight line in this order. However, the distance between the contact hole pattern 1 and the contact hole pattern 2 is included in the area (A) and the distance between the contact hole pattern 1 and the contact hole pattern 3 is included in the area (C). Therefore, the nodes 1, 2, and 3 are connected to one another by edges to form a triangular structure, i.e., an odd number loop. The nodes 1, 3, 4, 5, and 6 form a pentagonal odd number loop.

According to the same operation as the first embodiment, the closed-loop extracting unit 3 extracts a closed loop formed by the nodes 1, 2, and 3 and a closed loop formed by the nodes 1, 3, 4, 5, and 6 and extracts the nodes 1 and 3 as nodes located in connecting places. The rearrangement-target selecting unit 5 selects the node 1 or the node 3 as a rearrangement target.

The pattern rearranging unit 8 combines a contact hole pattern corresponding to the node selected by the rearrangement-target selecting unit 5 as the rearrangement target with an adjacent contact hole pattern, relaxes a limitation on a space such that a distance between the contact hole pattern corresponding to the selected node and the contact hole pattern adjacent to the contact hole pattern is a distance other than the area (A), the area (B), and the area (C), or removes the contact hole pattern corresponding to the selected node.

By rearranging the contact hole patterns in this way, it is possible to obtain a pattern layout design drawing that can split the contact hole patterns into two photomasks in which a distance between the contact hole patterns is not included in the area (A), the area (B), and the area (C).

As explained above, a distance between contact hole patterns for which an SRAF(s) can be arranged changes according to various conditions such as a lithography condition. Therefore, the graph creating unit 7 can set contact hole patterns, distances from which to adjacent contact hole patterns are included in two or four or more ranges, as nodes. A pattern layout design drawing treated in the second embodiment is not limited the pattern layout design drawing concerning contact hole patterns. The second embodiment can also be used for generating a pattern layout design drawing for arranging the SRAF(s). The second embodiment can also be used for correcting a pattern layout to arrange the SRAF (s).

As explained above, according to the second embodiment, a graph is created to set patterns, distances from which to adjacent patterns are included in a plurality of predetermined ranges, as nodes. Therefore, it is possible to efficiently select rearrangement target patterns and eliminate a conflict in a pattern layout design drawing to which an SRAF(s) are added.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern layout designing method comprising:
   creating, using a computer, a graph in which mask patterns adjacent to one another at a distance in which desired printing resolution cannot be obtained in a lithography process or a distance in which an assist pattern for obtaining the desired printing resolution cannot be arranged among mask patterns generated based on a pattern layout design drawing are set as nodes connected to one another by edges;
   extracting, using a computer, closed loops from the created graph;
   selecting, using a computer, an odd number loop formed by an odd number of nodes from the extracted closed loops;
   when the selected odd number loop is isolated, arbitrarily selecting nodes from the selected odd number loop as rearrangement target nodes;
   when the selected odd number loop is not isolated, based on whether a closed loop group, in which a plurality of closed loops including the odd number loop are connected, includes an even number loop formed by an even number of nodes, selecting rearrangement target nodes from the odd number loop included in the closed loop group according to different selection criteria; and
   rearranging, using a computer, a layout of patterns described in the pattern layout design drawing corresponding to the selected rearrangement target nodes.

2. The pattern layout designing method according to claim 1, wherein the selecting rearrangement target nodes from the odd number loop included in the closed loop group includes:
   repeating, when the closed loop group does not include an even number loop, an operation for removing a node having a largest number of closed loops connected thereto, until no odd number loop is left in the closed loop group;
   repeating, when the closed loop group includes an even number loop, an operation for removing a node not located in connecting places with other closed loops among nodes forming the odd number loop included in the closed loop group or a node having a largest number of closed loops connected thereto among nodes located in the connecting places excluding nodes whose removal cause creation of a new odd number loop among nodes in the connecting places, until no odd number loop is left in the closed loop group; and
   selecting all the nodes removed from the closed loop group as rearrangement target nodes.

3. The pattern layout designing method according to claim 1, wherein the distance in which the desired printing resolution cannot be obtained in the lithography process is a distance smaller than a predetermined distance.

4. The pattern layout designing method according to claim 1, wherein the distance in which the assist pattern cannot be arranged is a distance included in a plurality of predetermined ranges.

5. The pattern layout designing method according to claim 1, wherein the rearranging a pattern layout includes executing any one of removing the mask patterns corresponding to the selected rearrangement target nodes, adjusting distances to the adjacent mask patterns such that the desired printing resolution can be obtained between the mask patterns and the adjacent mask patterns, and combining the mask patterns corresponding to the selected rearrangement target nodes and the adjacent mask patterns.

6. A semiconductor device manufacturing method comprising:
   creating a graph in which mask patterns adjacent to one another at a distance in which desired printing resolution cannot be obtained in a lithography process or a distance in which an assist pattern for obtaining the desired printing resolution cannot be arranged among mask patterns generated based on a pattern layout design drawing are set as nodes connected to one another by edges;
   extracting closed loops from the created graph;
   selecting an odd number loop formed by an odd number of nodes from the extracted closed loops;
   when the selected odd number loop is isolated, arbitrarily selecting nodes from the selected odd number loop as rearrangement target nodes;
   when the selected odd number loop is not isolated, based on whether a closed loop group, in which a plurality of closed loops including the odd number loop are connected, includes an even number loop formed by an even number of nodes, selecting rearrangement target nodes from the odd number loop included in the closed loop group according to different selection criteria;
   rearranging layout of patterns described in the pattern layout design drawing corresponding to the selected rearrangement target nodes;

forming patterns on a semiconductor substrate based on the pattern layout design drawing in which the layout of patterns is rearranged; and manufacturing a semiconductor device from the semiconductor substrate on which the patterns are formed.

7. The semiconductor device manufacturing method according to claim 6, wherein the selecting rearrangement target nodes from the odd number loop included in the closed loop group includes:

repeating, when the closed loop group does not include an even number loop, an operation for removing a node having a largest number of closed loops connected thereto, until no odd number loop is left in the closed loop group;

repeating, when the closed loop group includes an even number loop, an operation for removing a node not located in connecting places with other closed loops among nodes forming the odd number loop included in the closed loop group or a node having a largest number of closed loops connected thereto among nodes located in the connecting places excluding nodes whose removal cause creation of a new odd number loop among nodes in the connecting places, until no odd number loop is left in the closed loop group; and selecting all the nodes removed from the closed loop group as rearrangement target nodes.

8. The semiconductor device manufacturing method according to claim 6, wherein the distance in which the desired printing resolution cannot be obtained in the lithography process is a distance smaller than a predetermined distance.

9. The semiconductor device manufacturing method according to claim 6, wherein the distance in which the assist pattern cannot be arranged is a distance included in a plurality of predetermined ranges.

10. The semiconductor device manufacturing method according to claim 6, wherein the rearranging a pattern layout includes executing any one of removing the mask patterns corresponding to the selected rearrangement target nodes, adjusting distances to the adjacent mask patterns such that the desired printing resolution can be obtained between the mask patterns and the adjacent mask patterns, and combining the mask patterns corresponding to the selected rearrangement target nodes and the adjacent mask patterns.

11. A computer program product embodied in a non-transitory computer-readable medium, which when executed by a computer, causes the computer to execute:

creating a graph in which mask patterns adjacent to one another at a distance in which desired printing resolution cannot be obtained in a lithography process or a distance in which an assist pattern for obtaining the desired printing resolution cannot be arranged among mask patterns generated based on a pattern layout design drawing are set as nodes connected to one another by edges;

extracting closed loops from the created graph;

selecting an odd number loop formed by an odd number of nodes from the extracted closed loops;

when the selected odd number loop is isolated, arbitrarily selecting nodes from the selected odd number loop as rearrangement target nodes;

when the selected odd number loop is not isolated, based on whether a closed loop group, in which a plurality of closed loops including the odd number loop are connected, includes an even number loop formed by an even number of nodes, selecting rearrangement target nodes from the odd number loop included in the closed loop group according to different selection criteria; and rearranging layout of patterns described in the pattern layout design drawing corresponding to the selected rearrangement target nodes.

12. The computer program product according to claim 11, wherein the selecting rearrangement target nodes from the odd number loop included in the closed loop group includes:

repeating, when the closed loop group does not include an even number loop, an operation for removing a node having a largest number of closed loops connected thereto, until no odd number loop is left in the closed loop group;

repeating, when the closed loop group includes an even number loop, an operation for removing a node not located in connecting places with other closed loops among nodes forming the odd number loop included in the closed loop group or a node having a largest number of closed loops connected thereto among nodes located in the connecting places excluding nodes whose removal cause creation of a new odd number loop among nodes in the connecting places, until no odd number loop is left in the closed loop group; and selecting all the nodes removed from the closed loop group as rearrangement target nodes.

13. The computer program product according to claim 11, wherein the distance in which the desired printing resolution cannot be obtained in the lithography process is a distance smaller than a predetermined distance.

14. The computer program product according to claim 11, wherein the distance in which the assist pattern cannot be arranged is a distance included in a plurality of predetermined ranges.

15. The computer program product according to claim 11, wherein the rearranging a pattern layout includes executing any one of removing the mask patterns corresponding to the selected rearrangement target nodes, adjusting distances to the adjacent mask patterns such that the desired printing resolution can be obtained between the mask patterns and the adjacent mask patterns, and combining the mask patterns corresponding to the selected rearrangement target nodes and the adjacent mask patterns.

* * * * *